(12) United States Patent
Gogoi

(10) Patent No.: US 7,159,459 B2
(45) Date of Patent: Jan. 9, 2007

(54) MULTIPLE MICROELECTROMECHANICAL (MEM) DEVICES FORMED ON A SINGLE SUBSTRATE AND SEALED AT DIFFERENT PRESSURES AND METHOD THEREFOR

(75) Inventor: Bishnu P. Gogoi, Phoenix, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 17 days.

(21) Appl. No.: 11/031,029

(22) Filed: Jan. 6, 2005

(65) Prior Publication Data
US 2006/0144142 A1 Jul. 6, 2006

(51) Int. Cl.
G01C 19/00 (2006.01)
H01L 21/50 (2006.01)
(52) U.S. Cl. ............... 73/504.02; 438/106; 438/108
(58) Field of Classification Search ............ 438/51–53, 438/15; 34/335; 73/504.02
See application file for complete search history.

(56) References Cited

U.S. PATENT DOCUMENTS 6,287,893 B1    9/2001   Elenius et al. ............. 435/69.1
6,470,594 B1 * 10/2002  Boroson et al. ............... 34/335
6,516,665 B1    2/2003   Varadan et al. .......... 73/504.01
6,770,506 B1    8/2004   Gogoi ......................... 438/52

OTHER PUBLICATIONS

Candler et al., "Single Wafer Encapsulation of MEMS Devices," IEEE Transactions on Advanced Packaging, vol. 26, No. 3, Aug. 2003, pp. 227-232.
Gogoi et al., "A Low-Voltage Force-Balanced Pressure Sensor with Hermetically Sealed Servomechanism," IEEE, 1999, pp. 493-498.
Lin et al., "Microelectromechanical Filters for Signal Processing," Journal of Microelectromechanical Systems, vol. 7, No. 3, Sep. 1998, pp. 286-294.

* cited by examiner

Primary Examiner—Hezron Williams
Assistant Examiner—Tamiko Bellamy
(74) Attorney, Agent, or Firm—Ingrassia Fisher & Lorenz

(57) ABSTRACT

Methods and apparatus are provided forming a plurality of semiconductor devices on a single substrate, and sealing two or more of the devices at different pressures. First and second semiconductor devices, each having a cavity formed therein, are formed on the same substrate. The cavity in the first device is sealed at a first pressure, and the cavity in the second device is sealed at a second pressure.

20 Claims, 3 Drawing Sheets

MULTIPLE MICROELECTROMECHANICAL (MEM) DEVICES FORMED ON A SINGLE SUBSTRATE AND SEALED AT DIFFERENT PRESSURES AND METHOD THEREFOR

TECHNICAL FIELD

The present invention generally relates to microelectomechanical (MEM) devices and, more particularly, to multiple MEM devices that are formed on the same substrate and that are sealed at different pressures.

BACKGROUND

Many devices and systems include various numbers and types of sensors. The varied number and types of sensors are used to perform various monitoring and/or control functions. Advancements in micromachining and other microfabrication techniques and associated processes have enabled manufacture of a wide variety of microelectromechanical (MEM) devices, including various types of sensors. Thus, in recent years, many of the sensors that are used to perform monitoring and/or control functions are implemented using MEM sensors.

Various types of MEM sensors have been implemented. For example, accelerometers, gyroscopes, and pressure sensors, just to name a few, have all been implemented using MEM technology. In many instances these MEM sensors includes sensor structures that are configured with relatively small clearance gaps. If small amounts of particulate or moisture were somehow introduced into these small clearance gaps, it could have deleterious effects on MEM sensor operation. Thus, in many instances the MEM sensors include a sealed protective cap that covers the sensor structure, and seals the sensor structure from the surrounding environment.

As is generally known, the pressure at which the sensor structure is sealed can affect its operational characteristics. For example, if the sensor structure for an accelerometer or vibrating gyroscope is sealed at or near atmospheric pressure, it will be overdamped, and if it is sealed at a vacuum, it will be underdamped. It will be appreciated that an overdamped accelerometer is more desirable than an underdamped one, and that an underdamped gyroscope is more desirable than an overdamped one. Thus, the sensor structures for MEM accelerometers are preferably sealed at or near atmospheric pressure, and the sensor structures for MEM gyroscopes are preferably sealed at a vacuum. Other MEM sensors that are preferably sealed at a vacuum include absolute pressure sensors and resonators.

Presently, all MEM sensors (and other types of MEM devices) that are formed on a substrate are sealed at the same pressure. As a result, all of the MEM devices on a single substrate are either overdamped or underdamped. Thus, if a system is being implemented that includes both an overdamped and an underdamped MEM device, the devices would need to be provided from separate substrates, rather than from a single substrate.

Accordingly, it is desirable to provide a method whereby a plurality of MEM devices may be formed on a single substrate and sealed at different pressures. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
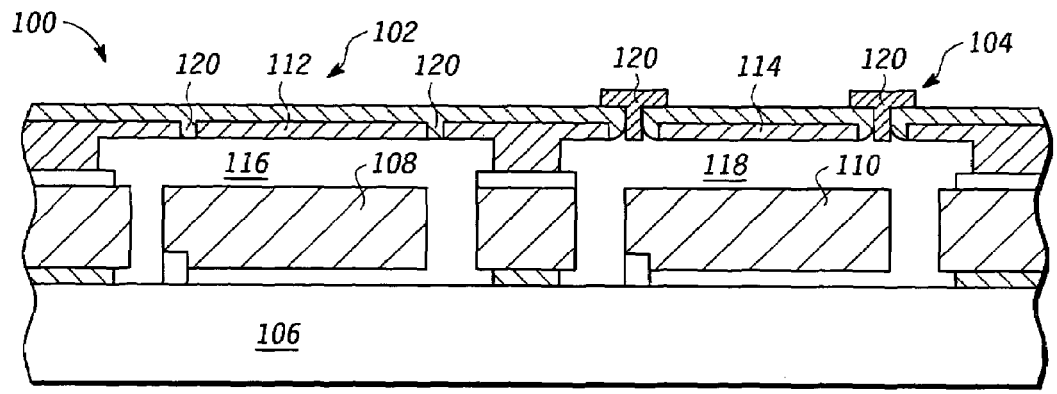
FIG. 1 is a simplified cross section view of a MEM device that includes a plurality of MEM sensors formed on the same substrate.

Turning now to the description, and with reference first to FIG. 1, a simplified cross section view of an exemplary microelectromechanical (MEM) device 100 is depicted. The depicted MEM device 100 is an inertial measurement unit (IMU) that includes two MEM sensors, an accelerometer 102 and a gyroscope 104, which are both formed on a single substrate 106. It will be appreciated that the IMU 100 could include more than one accelerometer 102 and/or more than one gyroscope 104 on the substrate 106, and it could additionally include one or more different types of MEM sensors. However, for clarity and ease of description and illustration, only a single accelerometer 102 and a single gyroscope 104 are shown. It will additionally be appreciated that the MEM device 100 need not be implemented as an IMU, but could be implemented as any one of numerous devices in which it may be desirable to have two or more different sensors (or other devices) formed on a single substrate 106 and sealed at different pressures.

The accelerometer 102 and gyroscope 104 each include one or more sensor structures 108 and 110, respectively, that are suspended above the substrate 106 by, for example, one or more suspension springs (not shown). It will be appreciated that the accelerometer 102 and gyroscope 104 may additionally include one or more non-illustrated moving electrodes and one or more non-illustrated fixed electrodes. The moving electrodes may form part of the suspended sensor structures 108, 110, and the fixed electrodes may be fixedly coupled to the substrate 106. The specific structure and configuration of the accelerometer 102 and gyroscope 104 may vary. Moreover, a description of the specific structure and configuration of the accelerometer 102 and gyroscope 104 is not needed to enable or fully describe the present invention, and will thus not be further described in more detail.

As FIG. 1 also shows, the accelerometer 102 and gyroscope 104 further include a protective cap 112 and 114, respectively. The protective caps 112, 114 are coupled to the substrate 106, and extend over at least the suspended sensor structures 108, 110 to provide physical protection thereof. It will be appreciated that the protective caps 112, 114 preferably extend over the entire sensor structure, both suspended and non-suspended portions. Each protective cap 112, 114 is spaced-apart from its suspended sensor structure 108, 110 to define a cavity 116, 118, respectively. As will be described more fully below, when the protective caps 112, 114 are formed, one or more etch openings 120 are formed in the protective caps 112, 114. These etch openings 120, which are preferably formed over non-suspended portions of the sensor structure, are used to allow chemical ingress into the respective cavities 116, 118 during a release etch process. As is generally known, the suspended sensor structures 108, 110 are released from the substrate 106 during the release etch process. The etch openings 120 are subsequently sealed to thereby seal the cavities 116, 118. In the depicted embodiment, the accelerometer cavity 116 is sealed at about atmospheric pressure and the gyroscope cavity 118 is sealed at a vacuum. Thus, the accelerometer 102 is over-damped, and the gyroscope 104 is under-damped.

Having described an embodiment of a MEM device 100 from a structural standpoint, a particular preferred process of sealing the described MEM device 100 will now be described. In doing so reference should be made, as appropriate, to FIGS. 2–10. It will be appreciated that, for clarity and ease of explanation, the process will be depicted and described using the MEM device 100 shown in FIG. 1. However, it will be further appreciated that the process is applicable to any one of numerous other MEM devices. It will additionally be appreciated that the process steps that are used to form the sensors 102, 104 will not be described, as these may be formed using any one of numerous processes, now known or developed in the future. Moreover, although for convenience the method is described using a particular order of steps, portions of the method could be performed in a different order or using different types of steps than what is described below.

Figure 2:
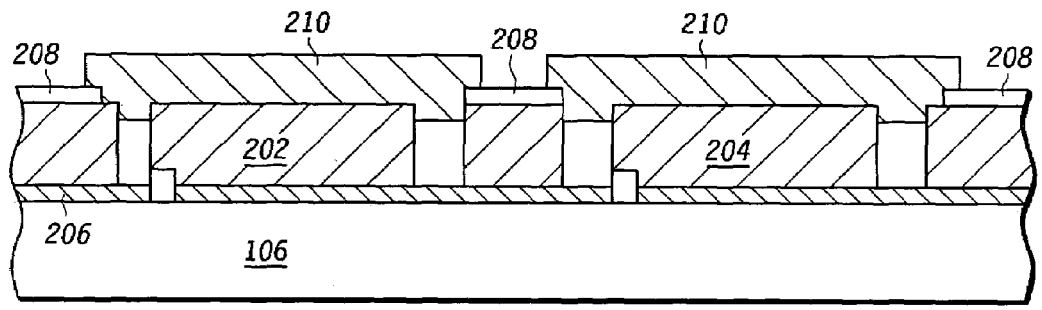
FIGS. 2–10 are simplified cross section views of the MEM device shown in FIG. 1, illustrating various exemplary methodological steps that are used to make various MEM devices in accordance with an embodiment of the present invention.

With the above background in mind, and with reference first to FIG. 2, two unreleased structures, a first unreleased structure 202 and a second unreleased structure 204 are formed on the substrate 106. In the depicted embodiment, the first 202 and second 204 unreleased structures are configured such that, upon being released, each will form the accelerometer and the gyroscope suspended sensor structures 108 and 110, respectively. The first 202 and second 204 unreleased sensor structures, as was just noted above, may be formed using any one of numerous processes and methods now known or developed in the future, and will not be further described. In the depicted embodiment, the first 202 and second 204 unreleased structures are each formed on, or otherwise affixed to the substrate 106 by one or more sacrificial material layers 206 such as, for example, a buried oxide layer. Moreover, one or more additional material layers, such as an electrical isolation material layer 208 and one or more additional sacrificial material layers 210, are formed (or deposited) over the first 202 and second 204 unreleased structures. The electrical isolation material 208 and the additional sacrificial materials 210 may be any one of numerous suitable materials. In the depicted embodiment, the electrical isolation material 208 comprises silicon nitride, and the additional sacrificial material 210 comprises phosphosilicate glass (PSG).

Figure 3:
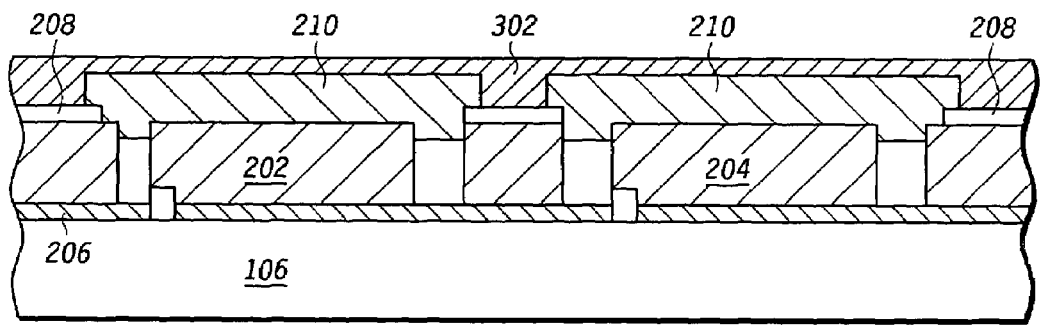

Following the formation of the first 202 and second 204 unreleased structures, the electrical isolation material layer 208, and the additional sacrificial material layers 210, a cap layer 302 is formed over the electrical isolation material layer 208 and the additional sacrificial material layers 210. In the depicted embodiment, which is shown in FIG. 3, the cap layer 302 is polycrystalline silicon that is deposited to a thickness of approximately 2–10 microns using, for example, a low pressure chemical vapor deposition (LPCVD) process or an epitaxial process. Following its deposition, the cap layer 302 may be annealed, if needed or desired, to decrease stress in the polysilicon. In addition to polysilicon, it will be appreciated that the cap layer 302 may be formed of any one of numerous other types of materials with suitable mechanical strength including, for example, germanium. Although the thickness may vary outside the 2–10 micron range, the cap layer 302 is preferably thick enough to withstand the pressures that may be generated when the MEM device 100 is subsequently packaged. Moreover, although the cap layer 302. in the depicted embodiment is formed as a single, contiguous layer that extends over both of the first 202 and second 204 unreleased structures, it will be appreciated that the cap layer 302 could be formed as a non-contiguous layer.

Figure 4:
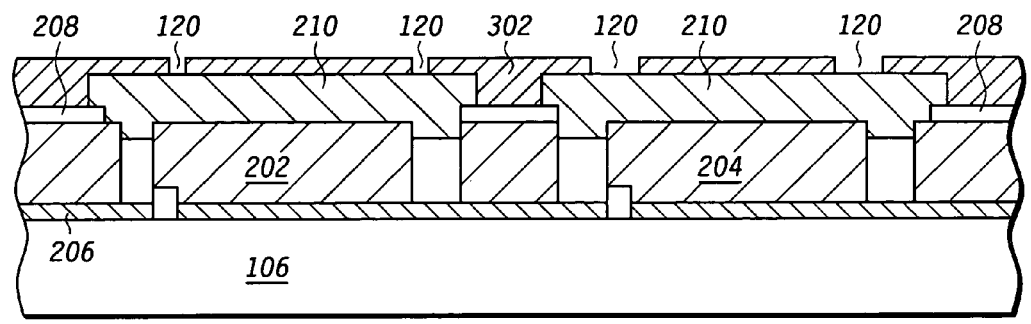

After the cap layer 302 is formed, and as shown more clearly in FIG. 4, the plurality of etch openings 120 are formed therein. The etch openings 120 may be formed using any one of numerous processes, but are preferably formed using any one of numerous etch processes. As was alluded to above, the etch openings 120 allow an etchant that is used during a release etch process to reach, and selectively remove at least portions of, the sacrificial material layers 206, 210. In the depicted embodiment, four etch openings 120 are formed in the cap layer 302, two for each unreleased structure 202, 204. It will be appreciated, however, that this is merely exemplary, and that more or less than this number of etch openings 120 may formed in the cap layer 302. In addition, although the specific size of the etch openings 120 for the first 202 and second 204 unreleased structures 202, 204 may vary, the relative size of etch openings 120 for the first 202 and second 204 unreleased structures differ. In a particular preferred embodiment, in which the first 202 and second 204 unreleased structures are, upon completion of the process, configured as the accelerometer 108 and the gyroscope 110 suspended structures, respectively, the size (e.g., width or diameter) of the etch openings 120 for the second unreleased structure 204 are formed so as to be larger than the etch openings 120 for the first unreleased structure 202. For example, if etch openings 120 for the first unreleased structure 202 are from about 1–3 microns in diameter, the etch openings 120 for the second unreleased structure 204 may be from about 3–6 microns in diameter. The reason for this will be described in more detail further below.

Figure 5:
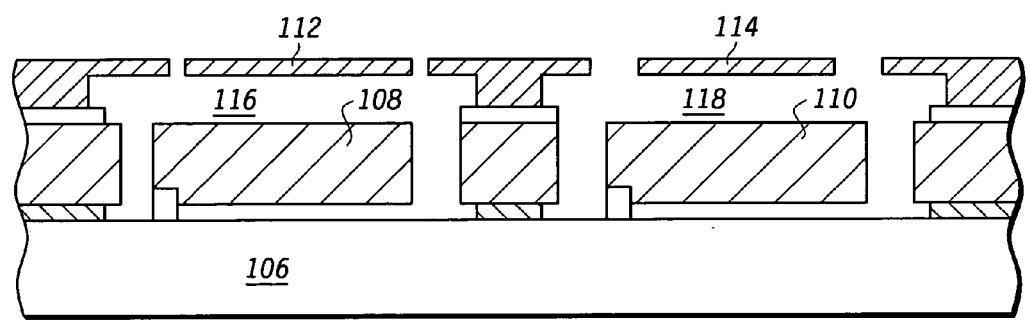

After the etch openings 120 are formed in the cap layer 302, the above-mentioned release etch process is performed to remove at least portions of the sacrificial material layers 206, 210 to thereby release the first 202 and second 204 unreleased structures. Various etch processes could be used to remove the sacrificial material layers 206, 210. For example, a wet etch process or a vapor phase etch process could be used. In a preferred embodiment, a wet etch process is used, and a wet etch solution, such as an aqueous hydrofluoric acid (HF) solution, is introduced into the etch openings 120 in the cap layer 302. No matter the specific etch process that is implemented, upon completion of the release etch process, and as shown in FIG. 5, the accelerator and gyroscope suspended sensor structures 108, 110 are released, and the respective protective caps 112 and 114 are formed.

The formed protective caps 112 and 114 extend over, and are spaced-apart from, the accelerator and gyroscope suspended sensor structures 108 and 110, respectively, to form the accelerator cavity 116 and gyroscope cavity 118, respectively. However, because the etch openings 120 in the protective caps 112, 114 are not sealed, particulate and moisture may enter the accelerometer 102 and gyroscope 104, and negatively affect performance. Moreover, the pressure within the cavities 116, 118 will be equal to the ambient pressure outside the protective caps 112, 114, which can also impact device performance, depending on the particular pressure of the ambient environment. Thus, the etch openings 120 in each of the protective caps 112, 114 are sealed at a desired pressure, to thereby seal the cavities 116, 118 at the desired pressure, and to also prevent ingress of particulate and moisture. A particular preferred method by which the etch openings 120 are sealed will now be described.

Figure 6:
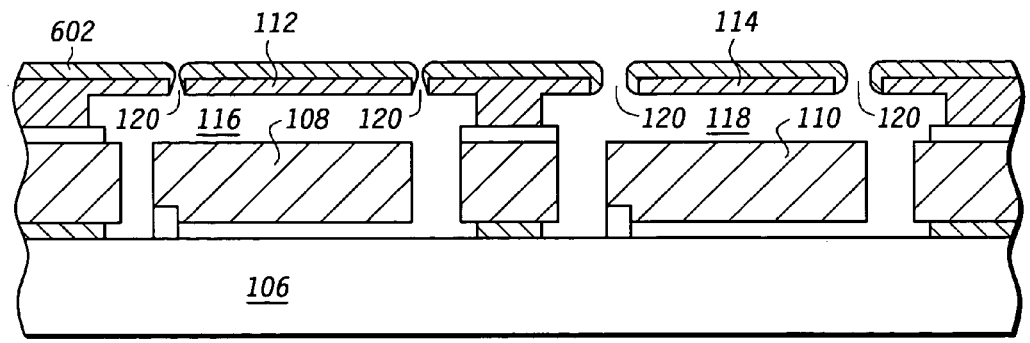

Turning first to FIG. 6, the opening sealing process begins by forming a reflowable material layer 602 over the protective caps 112, 114. The thickness of the reflowable material layer 602 may vary depending, at least in part, on the thickness of the protective caps 112, 114, and on the size of the etch openings 120 in the accelerometer protective cap 112, as these etch openings 120 are smaller than those in the gyroscope protective cap 114. It will be appreciated that the reflowable material 602 may comprise any one of numerous types of suitable materials such as, for example, borophosphosilicate glass (BPSG). In a preferred embodiment, however, the reflowable material 602 is PSG. It will additionally be appreciated that the reflowable material 602 may be formed using any one of numerous processes including, for example, plasma enhanced chemical vapor deposition (PECVD), physical vapor deposition (PVD), and atmospheric CVD.

Figure 7:
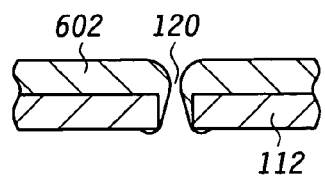
Figure 8:
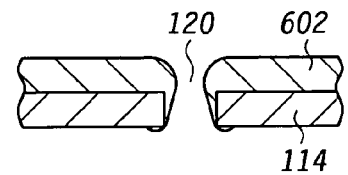

With reference to FIGS. 7 and 8, which are close-up views of portions of the accelerometer protective cap 112 and the gyroscope protective cap 114, respectively, it is seen that following formation of the reflowable material layer 602 none of the etch openings 120 are sealed. Instead, the reflowable material layer 602 is formed over the top surface of the protective caps 112, 114, and on the sidewalls of the etch openings 120. Nonetheless, because the etch openings 120 in the accelerometer protective cap 112 are smaller than those in the gyroscope protective cap 114, the etch openings 120 in the accelerometer protective cap 112 are closer to being sealed than the etch openings 120 in the gyroscope protective cap 114. Thus, subsequent processing, which will now be described, is implemented to fully seal the etch openings 120 in the accelerometer protective cap 112, while maintaining the etch openings 120 in the gyroscope protective cap 114 in an unsealed state.

As was previously noted, it is desired to seal the etch openings 120 in the accelerometer protective cap 112 at approximately atmospheric pressure so that the accelerometer cavity 116 will be at or near atmospheric pressure, and the accelerometer 102 will be overdamped. Thus, if the process used to form the reflowable layer 602 takes place at a vacuum, which is the case for PECVD, the MEM device 100 is removed from the vacuum and put into an environment that is at about atmospheric pressure for subsequent processing.

To seal the etch openings 120 in the accelerometer protective cap 112, the reflowable layer 602 is caused to reflow. In a particular embodiment, this is done by implementing a reflow anneal process at or near atmospheric pressure. It will be appreciated that parameters of the reflow anneal process may vary depending, for example, on the topography of the MEM device 100, and/or the reflow properties of the reflowable material 602. In one embodiment, the reflow anneal process is implemented in a furnace between about 1000 and about 1040 degrees Celsius, in atmosphere of $N_2$, $O_2$, or combination thereof. In an alternate embodiment, the reflow anneal process is implemented in a high pressure oxidation (HiPOX) furnace at a temperature between about 1,000 and about 1,040 degrees Celsius. In either embodiment, chemicals such as $POCL_3$ and $PH_3$ may be used as phosphorous sources. It will additionally be appreciated that a densification anneal process may be performed prior to the reflow anneal process at approximately 900–1000 degrees Celsius, in an $N_2$, $O_2$, or combination of the above, environment. It will additionally be appreciated that the anneal may occur on a global scale so that the entire MEM device 100 is annealed, or the anneal can occur on a local scale (i.e., localized annealing) so that only one area is exposed to the heat.

Figure 9:
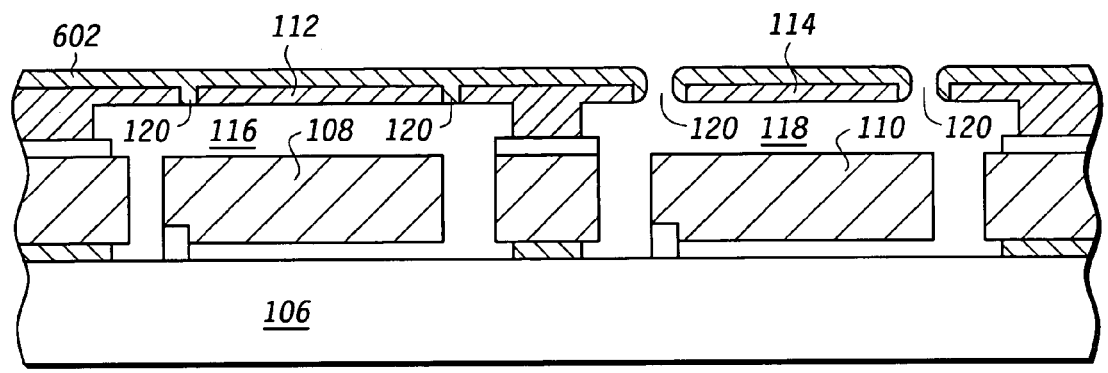

As shown in FIG. 9, following the reflow anneal process the reflowable material layer 602 has fully sealed etch openings 120 in the accelerometer protective cap 112. Moreover, because the reflow anneal process was conducted at about atmospheric pressure, the accelerometer cavity 116 is sealed at approximately atmospheric pressure. Thus, the accelerometer 102 is overdamped. However, as is also shown in FIG. 9, the etch openings 120 in the gyroscope protective cap 114 are only partially closed following the reflow anneal process. Thus, additional processing is implemented to seal these etch openings 120. Moreover, it should be appreciated that instead of implementing the reflow anneal process, the etch openings 120 in the accelerometer protective cap 114 could be sealed using, for example, atmospheric CVD.

Figure 10:
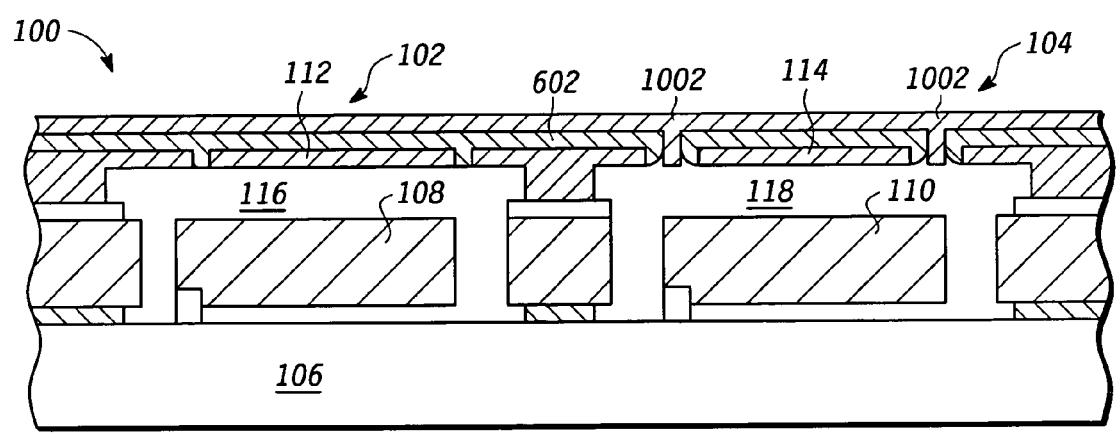

With reference now to FIG. 10, the partially closed etch openings 120 in the gyroscope protective cap 114 are sealed using by depositing (or forming) another layer of material 1002 over the reflowable material layer 602, and into the partially closed etch openings 120, using any one of numerous processes that may be implemented in a vacuum environment. For example, a PECVD process, a sputtering process, or an evaporation process may be used. Alternatively, another reflow annealing process may be implemented in a vacuum environment. The material 1002 that is deposited in the unsealed openings 120 may vary. For example, the material 1002 may be PSG, BPSG, or TEOS, but in a particular preferred embodiment the material 1002 is PSG. Although not depicted, it will be appreciated that additional processing steps, including patterning of the material 1002 and/or deposition of additional layers, may be implemented, if needed or desired. Because the etch openings 120 in the gyroscope protective cap 114 were sealed in a vacuum environment, the gyroscope cavity 118 is sealed at a vacuum. Thus, the gyroscope 102 is underdamped.

The inventive method described herein provides a plurality of semiconductor devices formed on the same substrate and sealed at different pressures. As was previously noted, the above-described method could be used to implement any one of numerous devices in which it may be desirable to have two or more different sensors (or other devices) formed on a single substrate and sealed at different pressures. Moreover, the process steps may be performed in an alternative order than what is presented. For example, the sealing in a vacuum can be done before sealing at or near atmospheric pressure.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of forming a plurality of semiconductor devices on a single substrate, comprising:
   forming a first semiconductor device on the substrate, the first semiconductor device having a first cavity formed therein;
   forming a second semiconductor device on the substrate, the second semiconductor device having a second cavity formed therein;
   sealing the first cavity at a first pressure; and
   sealing the second cavity at a second pressure.

2. The method of claim 1, wherein the second cavity is partially closed when the first cavity is sealed at the first pressure.

3. The method of claim 1, wherein:
   the first pressure is a positive pressure; and
   the second pressure is a vacuum pressure.

4. The method of claim 3, wherein the positive pressure is substantially equal to atmospheric pressure.

5. The method of claim 4, wherein:
   the first semiconductor device is an overdamped accelerometer; and
   the second semiconductor device is an underdamped gyroscope.

6. The method of claim 1, wherein the step of forming the first and second semiconductor devices comprises:
   forming a cap layer over at least portions of the substrate to thereby form the first and second cavities;
   forming a first opening through the cap layer and into the first cavity; and
   forming a second opening through the cap layer and into the second cavity, the second opening larger in diameter than the first opening.

7. The method of claim 6, wherein the step of sealing the first cavity, comprises:
   forming a first material layer over at least a portion of the cap layer; and
   annealing the first material layer at the first pressure, to thereby seal the first cavity and partially seal the second cavity.

8. The method of claim 7, wherein the step of sealing the second cavity, comprises:
   forming a second material layer over at least a portion of the cap layer, to thereby fully seal the second cavity.

9. The method of claim 8, wherein the second material layer is formed in a vacuum environment.

10. The method of claims 1, wherein the substrate includes a first sacrificial material on a surface thereof, and wherein the steps of forming the first and second semiconductor devices comprise:
    forming first and second unreleased structures on the first sacrificial layer;
    forming a layer of a second sacrificial material over at least portions of the first and second unreleased structures;
    forming a cap layer over at least portions of the layer of second sacrificial material;
    forming a first opening and a second opening through the cap layer, the second opening larger in diameter than the first opening; and
    removing at least portions of the first and second sacrificial materials to thereby release the first and second unreleased structures and form the first and second cavities.

11. The method of claim 10, wherein the step of sealing the first and second cavities, comprises:
    forming a first material layer over the cap layer;
    annealing the first material layer at the first pressure, to thereby seal the first cavity and partially seal the second cavity; and
    depositing a second material layer over at least a portion of the cap layer, to thereby fully seal the second cavity.

12. The method of claim 11, wherein:
    the first material layer is annealed at about atmospheric pressure; and
    the second material layer is deposited at a vacuum pressure,
    whereby the first cavity is sealed at about atmospheric pressure and the second cavity is sealed at a vacuum.

13. A semiconductor device, comprising:
    a first device formed on a semiconductor substrate, the first device including a first sensor surrounded by a first cavity that is sealed at a first pressure; and
    a second device formed on the semiconductor substrate, the second device including a second sensor surrounded by a second cavity that is sealed at a second pressure.

14. The device of claim 13, wherein:
    the first pressure is a positive pressure; and
    the second pressure is a vacuum pressure.

15. The device of claim 14, wherein the first pressure is substantially equal to atmospheric pressure.

16. The device of claim 14, wherein:
    the first sensor is an over-damped accelerometer; and
    the second sensor is an under-damped gyroscope.

17. A semiconductor device, comprising:
    a substrate having a surface;
    a first structure coupled to, and suspended above, the substrate surface;
    a second structure coupled to, and suspended above, the substrate surface;
    a first sealed protective cap coupled to the substrate, the first sealed cavity extending over the first structure and at least partially spaced-apart therefrom to thereby form a first sealed cavity between the first structure and the first sealed protective cap; and
    a second sealed protective cap coupled to the substrate, the second sealed cavity surrounding the second structure and at least partially spaced-apart therefrom to thereby form a second sealed cavity between the second structure and the second sealed protective cap,
    wherein the first sealed cavity is at a first pressure and the second sealed cavity is at a second pressure.

18. The device of claim 17, wherein:
    the first pressure is a positive pressure; and
    the second pressure is a vacuum pressure.

19. The device of claim 18, wherein the first pressure is substantially equal to atmospheric pressure.

20. The device of claim 18, wherein:
    the first structure is configured as an accelerometer; and
    the second structure is configured as a gyroscope.

* * * * *